(12) United States Patent
Klieber et al.

(10) Patent No.: US 11,781,892 B2
(45) Date of Patent: Oct. 10, 2023

(54) ULTRASONIC GAS FLOW METER HAVING ENHANCED NOISE IMMUNITY MULTILAYER PIEZOELECTRIC TRANSDUCER

(71) Applicant: Honeywell International Inc., Morris Plains, NJ (US)

(72) Inventors: Christoph Klieber, Rhineland-Palatinate (DE); Christian L. Bies, Rhineland-Palatinate (DE)

(73) Assignee: Honeywell International Inc., Charlotte, NC (US)

( * ) Notice: Subject to any disclaimer, the term of this patent is extended or adjusted under 35 U.S.C. 154(b) by 244 days.

(21) Appl. No.: 17/122,555

(22) Filed: Dec. 15, 2020

(65) Prior Publication Data
US 2022/0187112 A1     Jun. 16, 2022

(51) Int. Cl.
*G01F 1/66* (2022.01)
*G01F 1/667* (2022.01)
*H10N 30/50* (2023.01)
*H10N 30/80* (2023.01)
*H10N 30/85* (2023.01)

(52) U.S. Cl.
CPC .............. *G01F 1/662* (2013.01); *G01F 1/667* (2013.01); *H10N 30/50* (2023.02); *H10N 30/80* (2023.02); *H10N 30/85* (2023.02)

(58) Field of Classification Search
None
See application file for complete search history.

(56) References Cited

U.S. PATENT DOCUMENTS

| | | | |
|---|---|---|---|
| 5,594,181 A | 1/1997 | Stangee | |
| 5,744,898 A * | 4/1998 | Smith | B06B 1/064 600/459 |
| 7,658,114 B1 | 2/2010 | Sui et al. | |
| 8,146,442 B2 | 4/2012 | Stehouwer | |
| 8,616,061 B2 * | 12/2013 | Sugiura | G01S 7/52006 367/129 |
| 9,267,829 B2 | 2/2016 | Chevrier et al. | |
| 9,618,481 B2 | 4/2017 | Kruger | |
| 11,073,697 B1 * | 7/2021 | Sharma | G02F 1/292 |
| 2005/0236932 A1 * | 10/2005 | Nagahara | G01F 1/662 310/334 |
| 2006/0185430 A1 * | 8/2006 | Yogeswaren | G01N 29/222 73/152.16 |
| 2008/0139939 A1 | 6/2008 | Ohmura et al. | |

(Continued)

FOREIGN PATENT DOCUMENTS

EP        1955019 B1        3/2017

OTHER PUBLICATIONS

"Q.SONIC® PLUS Multi-Path Ultrasonic Gas Meter for Custody Transfer Measurement", 2019, Honeywell International Inc.

(Continued)

*Primary Examiner* — Harshad R Patel
(74) *Attorney, Agent, or Firm* — Ortiz & Lopez, PLLC; Kermit D. Lopez; Luis M. Ortiz

(57) ABSTRACT

A transducer sensor apparatus can include a sensor, and a multilayer transducer can include a plurality of piezoelectric elements. The sensor can include the multilayer transducer, and the multilayer transducer can improve a signal-to-noise ratio during sensing operations by the sensor by overcoming an external noise source.

18 Claims, 4 Drawing Sheets

(56) References Cited

U.S. PATENT DOCUMENTS

| | | | |
|---|---|---|---|
| 2012/0271569 A1 | 3/2012 | Takigami et al. | |
| 2012/0112607 A1* | 5/2012 | Kim | C04B 35/62645 |
| | | | 29/25.35 |
| 2016/0109272 A1* | 4/2016 | Teufel | G01F 1/662 |
| | | | 73/861.28 |
| 2016/0320219 A1* | 11/2016 | Hellevang | G01P 5/001 |
| 2018/0058209 A1* | 3/2018 | Song | G01F 1/74 |
| 2020/0405258 A1* | 12/2020 | Dayton | A61B 17/22004 |
| 2021/0278530 A1* | 9/2021 | Haque | B06B 1/067 |

OTHER PUBLICATIONS

Wikipedia, "Piezoelectric sensor", Retrieved from "https://en.wikipedia.org/w/index.php?title=Piezoelectric_sensor&oldid=987519193", page last edited on Nov. 7, 2020, at 15:53 (UTC).
"The Piezoelectric Effect", Piezoelectric Motors & Motion Systems, https://www.nanomotion.com/, downloaded Nov. 16, 2020, 3:55 PM.
Wikpedia, "Piezoelectricity", Retrieved from "https://en.wikipedia.org/w/index.php?title=Piezoelectricity&oldid=986732208", page last edited on Nov. 2, 2020, at 17:48 (UTC).
"ELSTER® Q.Sonic® plus Ultrasonic Flow Meter for Natural Gas Custody Transfer Measurement", Honeywell Connected Industrial, 2017, Honeywell International, Inc.
"Q.SONIC® MAX Multi-path ultrasonic gas meter highest industry standard for custody transfer", 2019, Honeywell International Inc.
"Ultrasonic Flow Meter Series 6 Manual Operation and Maintenance", elster Instromet, Jun. 7, 2018.

\* cited by examiner ated by a bullhorn. The receiver 104 is disposed above a flow
ULTRASONIC GAS FLOW METER HAVING ENHANCED NOISE IMMUNITY MULTILAYER PIEZOELECTRIC TRANSDUCER

TECHNICAL FIELD

Embodiments relate to ultrasonic flow measurement, in particular an apparatus, system, and method for measuring a flow characteristic (e.g. flow velocity and/or throughput of a fluid in a conduit or flow channel). Embodiments also relate to multilayer piezoelectric elements utilized for ultrasonic sensors implemented in flow measurement devices. Embodiments also relate to regulator noise and intrinsically safety requirements for industrial applications. Embodiments further relate to an enhanced noise immunity multilayer piezoelectric transducer.

BACKGROUND

Ultrasonic flow measurement of fluids flowing in a conduit or flow channel is generally known in the art. This involves transmitting ultrasonic sound waves between a transmitter and a receiver, which can be spaced apart in axial direction of a conduit, in a downstream direction of the fluid flow and in the upstream direction thereof. The transit time of the ultrasonic waves can be measured. From the difference in transit time of the downstream directed ultrasonic wave and the upstream directed wave an average flow velocity or throughput can be calculated based on a known geometry of the conduit or flow channel. The fluid may be a gas, vapor or liquid, such as natural gas.

Multilayer piezo elements can be used as actuators and in high-power ultrasonic flow measurement in industrial applications. Due to the specific functionality of multilayer piezo elements, however, these elements may not be suitable for ultrasonic sensing applications, because they typically decrease the overall signal-to-noise ratio SNR in both, pulse-echo and pitch-catch implementations.

A basic principle of multilayer piezo elements is the following: instead of having a single, thick piece of piezo ceramic material with electrodes on top and on bottom, the piezo-material can be cut into a number N slices, which can be then glued back together with additional electrodes at each layer. These electrodes may be connected with an alternating pattern and when driven with a voltage V, each slice can "see" this voltage over its thickness, which is only 1/N of the overall thickness. This means that the overall element "sees" the multiplication of the voltage by the number of slices V×N, which can result in an equally increased displacement.

An example of this situation can be a case of an actuator element having a thousand slices. When the actuator element is driven by 20V, instead of having a displacement of 0.1 µm, the voltage drive can result in a displacement close to 100 µm, because the overall element 'sees' an effective voltage of 1000×20V=20000V. Unfortunately, upon reception, the effect is opposite and results in an equally large reduction in sensitivity. Together with real world "friction losses", this concept typically does not make sense for pulse-echo or pitch-catch operations using the same sensors. (This may only make sense in a pitch-catch operation, wherein a dedicated transmitter may always emit and a different transducer senses.)

In the very specific situation when an active ultrasonic noise source (such as a pressure regulator close to an ultrasonic gas flow meter) adds noise to the signal, however, the increased-energy propagating ultrasonic wave may rise sufficiently above the external noise source. As discussed above, the downside of this concept is that the receiver operation becomes reduced by a similar factor as the increase on the transmitter side. This can be compensated, however, with sufficiently low SNR reception electronics.

FIG. 1 illustrates a schematic diagram of a prior art ultrasonic transducer 100 that includes a driver/receiver unit 102 that is electronically connected to a transmitter 106 and a receiver 104. Note that in FIG. 1, 'noise' 108 is represented by a bullhorn. The receiver 104 is disposed above a flow channel 110 and the transmitter 106 is located below the transmitter 106.

FIG. 1 depicts an example of a conventional design in which a transducer can be is used to drive a voltage of about +−/20 V with which we can assume the receiver 104 registers 1 mV when both, a transmitter 106 and the receiver 104 are standard, with the use of full material piezos, as indicated by the example standard drive configuration 112 in FIG. 1. Note that in the standard drive configuration 112, the signal level is indicated as signal level 117 and the noise level is shown as noise level 116.

When, instead, for example, ten sliced multilayer piezos may be used for the transmitter 106 and the receiver 104, the transmitter 106 may react as if it was applied with an effective transmitter voltage close to 200 V as shown in the example high voltage drive configuration 114. This situation can increase the voltage field over the transmitter 106 and emit 20 dB higher signals, which can raise the signal above the regulator noise and through this make a measurement possible. This described scenario is thus visually explained in FIG. 1.

One may ask why not increase the overall drive voltage applied on the transmitter? While some system still use high drive voltages (e.g., hundreds of volts) and through this beat high external noise sources, the industry has overall moved to intrinsically safe design concepts, which limit the overall firing voltage to quite low values. Intrinsically safe concepts allow for a significant reduction in manufacturing costs and the bulkiness of the installation (i.e., no explosion-safe packaging required anymore) and are therefore desirable.

To date, however, conventional designs such as shown in FIG. 1, have not been practical. That is, ultrasonic meters deployed in an environment with pressure regulators nearby will experience functional difficulties, which makes their operation challenging or impossible. The noise generated by the pressure regulator may just be too loud relative to the ultrasonic signal generated by the transmitter 106 and the overall signal registered by the receiver in the driver/receiver 102 may not have the necessary SNR for a proper measurement.

BRIEF SUMMARY

The following summary is provided to facilitate an understanding of some of the features of the disclosed embodiments and is not intended to be a full description. A full appreciation of the various aspects of the embodiments disclosed herein can be gained by taking the specification, claims, drawings, and abstract as a whole.

It is, therefore, one aspect of the disclosed embodiments to provide for improved ultrasonic flow measurement devices, methods, and systems.

It is another aspect of the disclosed embodiments to provide for a transducer sensor apparatus that includes a multilayer transducer.

It is a further aspect of the disclosed embodiments to provide for a multilayer transducer for use in ultrasonic flow sensor applications.

It is yet another aspect of the disclosed embodiments to provide for a multilayer transducer with an improved signal-to-noise ratio.

It is also an aspect of the disclosed embodiments to provide for a multilayer transducer apparatus in which an external noise source (e.g., regulator noise) can be overcome for industrial applications and intrinsic safety.

The aforementioned aspects and other objectives can now be achieved as described herein. In an embodiment, a transducer sensor apparatus can include a sensor, and a multilayer transducer comprising a plurality of piezoelectric elements. The sensor can include the multilayer transducer, and the multilayer transducer can improve a signal-to-noise ratio during sensing operations by the sensor by overcoming ann external noise source.

In an embodiment of the transducer sensor apparatus, the external noise source may be a regulator noise.

In an embodiment of the transducer sensor apparatus, the sensor may be an ultrasonic sensor.

In an embodiment of the transducer sensor apparatus, the sensor may be a flow measurement device.

In an embodiment of the transducer sensor apparatus, the flow measurement device may be an ultrasonic gas flow meter.

In an embodiment of the transducer sensor apparatus, the sensor can be located between one or more transmitters and one or more receivers, and the multilayer transducer can include the transmitter(s) and the receiver(s).

In an embodiment of the transducer sensor apparatus, each piezoelectric element among the plurality of piezoelectric transducers can comprise a piezo-ceramic element.

In an embodiment of the transducer sensor apparatus, the piezo-ceramic element can comprise one or more of: zirconate titanate (PZT), barium titanate ($BaTiO_3$) and bismuth sodium titanate.

In an embodiment of the transducer sensor apparatus, the external noise source may be associated with an industrial application requiring intrinsic safety.

In another embodiment, a method of operating a transducer sensor apparatus, can involve: providing a sensor and a multilayer transducer comprising a plurality of piezoelectric elements, the sensor including the multilayer transducer; and improving with the multilayer transducer, a signal-to-noise ratio during sensing operations by the sensor by overcoming an external noise source in an industrial application.

In another embodiment, a transducer sensor apparatus can include: a sensor comprising an ultrasonic sensor comprising a flow measurement device, wherein the sensor is located between at least one transmitter and at least one receiver; and a multilayer transducer comprising a plurality of piezoelectric elements, the sensor including the multilayer transducer, wherein the multilayer transducer improves a signal-to-noise ratio during sensing operations by the sensor by overcoming a regulator noise associated with an industrial application.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

Figure 1:
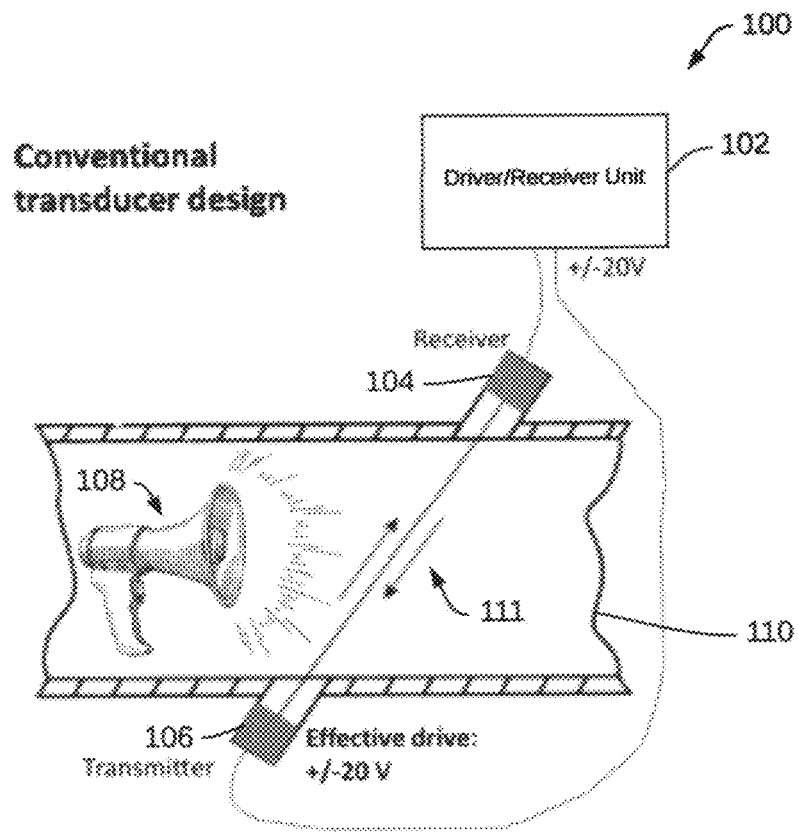
FIG. 1 illustrates a schematic diagram of a prior art ultrasonic transducer.
Figure 1:
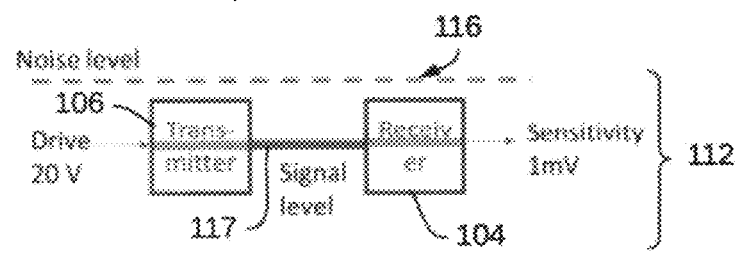
Figure 1:
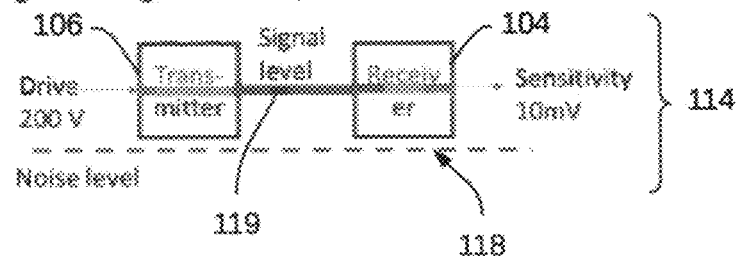

The particular values and configurations discussed in these non-limiting examples can be varied and are cited merely to illustrate one or more embodiments and are not intended to limit the scope thereof.

Subject matter will now be described more fully hereinafter with reference to the accompanying drawings, which form a part hereof, and which show, by way of illustration, specific example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other issues, subject matter may be embodied as methods, devices, components, or systems. Accordingly, embodiments may, for example, take the form of hardware, software, firmware, or a combination thereof. The following detailed description is, therefore, not intended to be interpreted in a limiting sense.

Throughout the specification and claims, terms may have nuanced meanings suggested or implied in context beyond an explicitly stated meaning. Likewise, phrases such as "in one embodiment" or "in an example embodiment" and variations thereof as utilized herein may not necessarily refer to the same embodiment and the phrase "in another embodiment" or "in another example embodiment" and variations thereof as utilized herein may or may not necessarily refer to a different embodiment. It is intended, for example, that claimed subject matter include combinations of example embodiments in whole or in part.

In general, terminology may be understood, at least in part, from usage in context. For example, terms such as "and," "or," or "and/or" as used herein may include a variety of meanings that may depend, at least in part, upon the context in which such terms are used. Generally, "or" if used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures, or characteristics in a plural sense. Similarly, terms such as "a," "an," or "the", again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

As discussed earlier flow control valves used in industrial process control applications may emit strong acoustic noise and vibrations that can disturb the environment and create problems in manufacturing or industrial operations. Flow conditioners and noise filters may be used between a flow control valve and a meter to block the line of sight of noise travelling with the fluid and also effectively absorb them. This approach, however, may introduce an additional and unwanted pressure drop in the flow.

The disclosed embodiments can offer a solution to these problems by combining noise filtering aspect within the control valve to assist in reducing the noise issue at the source (i.e. flow control valve). This approach can be used to reduce the costs for an expansion sleeve and additional costs for noise reduction parts (e.g., metal foam). The embodiments can be used in bi-directional operation conditions, which is advantageous because most noise reduction installations function well only in one direction. This approach can potentially reduce the need for additional flow conditioners by providing a solution with inbuilt noise reduction, and which can be implemented in, for example, a pipe or between the valve and meter or expansive silencer, which may save additional costs.

Multilayer piezo sensors are widely used as actuators and high-power ultrasonic emitters, however, not as sensors. This is because the gain achieved on the transmission may be lost upon reception. The concept of multilayer piezo sensors may only make sense in the case of a very specific asymmetry in signal propagation (e.g., such as an active noise source added in the propagation path between the transmitter and the receiver). The implementation of multilayer piezo sensors may enable significant SNR improvement in case of a regulator noise environment and may change the situations from 'not possible' to conducting stable measurements that can make stable flow measurements possible.

Figure 2:
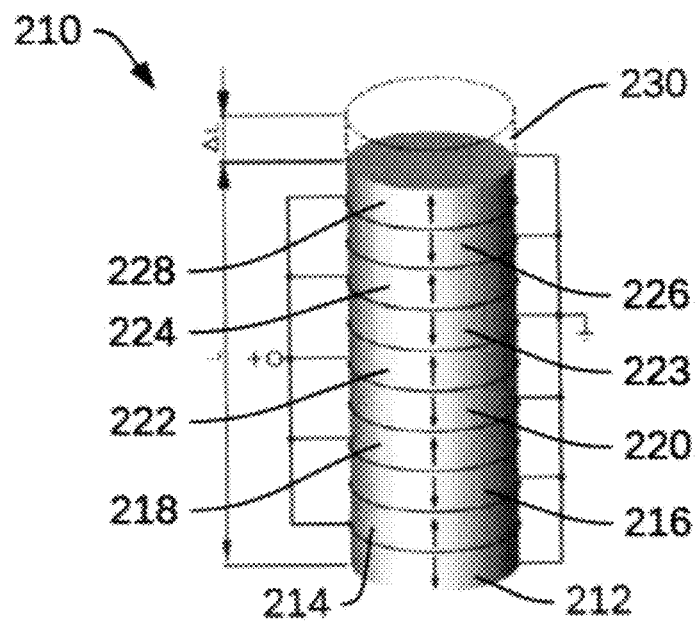
FIG. 2 illustrates a pictorial diagram of a multilayer transducer, in accordance with an embodiment.

FIG. 2 illustrates a pictorial diagram of a multilayer transducer 210, in accordance with an embodiment. The multilayer transducer 210 shown in FIG. 2 can include a group of sliced ceramic piezo elements including but not limited to piezo element 212, piezo element 214, piezo element 216, piezo element 218, piezo element 220, piezo element 222, piezo element 223, piezo element 224, piezo element 226, and piezo element 228. In some embodiments additional piezo elements may be used such as piezo element 230, and so on. It can be appreciated that fewer or more sliced ceramic piezo elements may be implemented in accordance with other embodiments.

Each ceramic piezo element of the multilayer transducer 210 can comprise a piezo electric transducer. Thus, the multilayer transducer 210 can include a plurality of piezoelectric transducers, and as will be explained in further detail herein, can be implemented in association with a sensor that can include the multilayer transducer to improve a signal-to-noise ratio during sensing operations by the sensor. Such a sensor may be, for example, an ultrasonic sensor utilized in a flow measurement device.

Note that a non-limiting example of a sensor and associated components in which the multilayer transducer 210 and/or the other disclosed embodiments may be implemented is the Q.Sonic family type multi-path ultrasonic gas meter, an example of which is disclosed in the document "Q.Sonic Multi-Path Ultrasonic Gas Meter for Custody Transfer Measurement", 2019, Honeywell International Inc., which is incorporated herein by reference in its entirety.

Another non-limiting example of a sensor and associated components in which the multilayer transducer 210 may be implemented can include the configuration disclosed in the document, "Q.Sonic Max Multi-path ultrasonic gas meter highest industry standard for custody transfer," which is incorporated herein by reference in its entirety.

The terms "piezo ceramic", "ceramic piezo element" and "piezo-ceramic" as utilized herein can relate to piezoceramics, such as lead zirconate titanate (PZT), and non-lead based piezo ceramics such as barium titanate ($BaTiO_3$) and bismuth sodium titanate, which can be used for sensors and actuators.

The term "piezo" as utilized herein can refer to "piezoelectric", which relates to the piezoelectric effect involving the ability of certain materials to generate an electric charge in response to an applied mechanical stress. One of the unique characteristics of the piezoelectric effect is that it is reversible, meaning that materials exhibiting the direct piezoelectric effect (the generation of electricity when stress is applied) also exhibit the converse piezoelectric effect (the generation of stress when an electric field is applied). When piezoelectric material is placed under mechanical stress, a shifting of the positive and negative charge centers in the material takes place, which then results in an external electrical field. When reversed, an outer electrical field either stretches or compresses the piezoelectric material.

Note that ultrasonic signals required for the flow measurement can be generated and received by ultrasonic transducers. Piezoelectric transducers can employ crystals or ceramics that can be set into vibration when an alternating voltage can be applied to the piezoelectric element. The vibrating element can generate sound waves in a fluid (e.g., a liquid or a gas). Since the piezoelectric effect can be reversible, the element can become electrically polarized and can produce voltages related to the mechanical strain, when the crystal is distorted by the action of incident sound waves. Because the acoustic impedance of the fluid is much smaller compared to the acoustic impedance of the piezoelectric element, and to maximize the acoustic efficiency, a matching layer can be employed in some embodiments between the fluid and the piezoelectric element.

Figure 3:
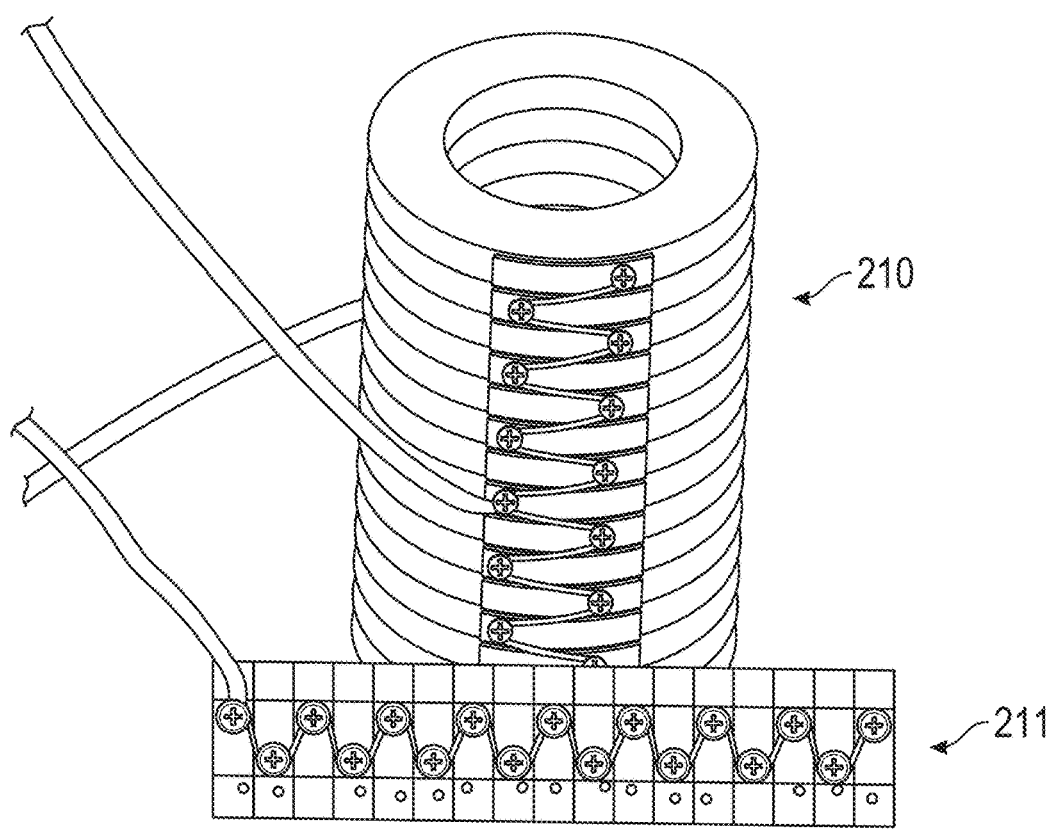
FIG. 3 illustrates an image of a multilayer transducer, in accordance with an embodiment.

FIG. 3 illustrates an image of the multilayer transducer 210 shown in FIG. 2, in accordance with an embodiment. In addition, a side view 210 of the multilayer transducer 210 is also depicted in the image in FIG. 3. The multilayer transducer 210 shown in FIG. 2 and FIG. 3 can be implemented in the context of an actuator (not shown in FIG. 2 and FIG. 3).

Each ceramic piezo element of the multilayer transducer 210 can comprise a piezo electric transducer formed from a piezoelectric ceramic. Note that the term 'piezo element' as utilized herein can relate to a piezoelectric ceramic, which is a 'smart' material that can convert a mechanical effect (e.g., such as pressure, movement, or vibration) into an electrical signal and vice versa.

Applications of the disclosed multilayer piezo ceramic device can include multilayer piezo arrangements (e.g., up to thousands of elements) used in ultrasonic actuators where a large displacement is needed (in this case it may not be a sensor, just an actuator). Other multilayer piezo arrangements (e.g., up to thousands of elements) can be used in high-power ultrasonic applications such as ultrasonic welding (in this case the device may only be an ultrasonic transmitter).

Figure 4:
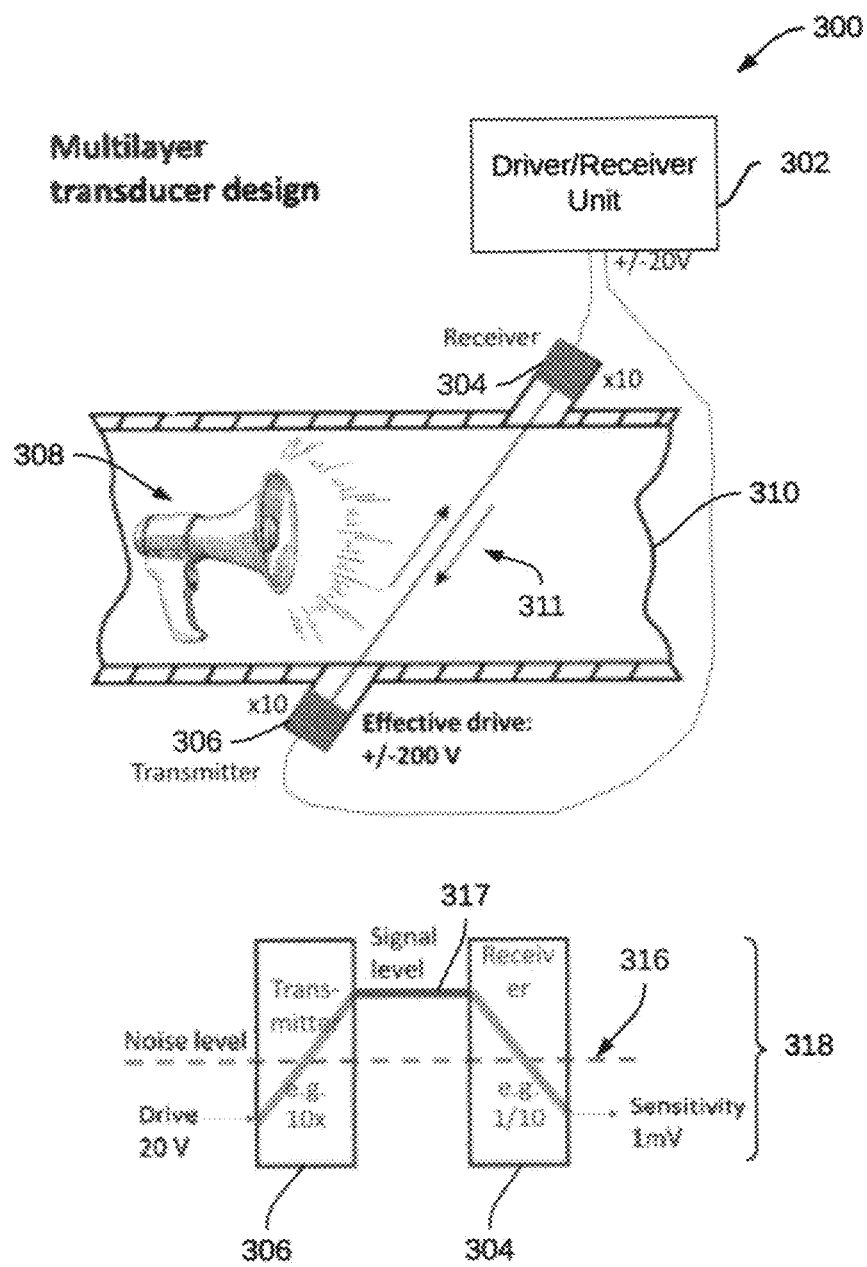
FIG. 4 illustrates a schematic diagram of a multilayer transducer, in accordance with an embodiment

FIG. 4 illustrates a schematic diagram of a ultrasonic transducer 300, in accordance with an embodiment. The ultrasonic transducer 300 depicted in FIG. 4 includes a transmitter 306 and a receiver 304 and can function as an enhanced noise immunity multilayer piezoelectric transducer. The transmitter 306 and the receiver 304 can be located on opposite sides of a flow channel 310. Note that in some embodiments, the flow channel 310 may be implemented as a part of a flow cell that can be mounted in, for example, a conduit or piping system in an industrial application. Various components such as transducers, temperatures sensors, pressure sensors and so on, may be mounted on the flow cell. Note that the term 'conduit' as utilized herein can refer to a flow channel, pipe, etc., and can relate to a channel through which something (e.g., such as a fluid (a gas or a liquid)) may be conveyed.

The ultrasonic transducer 300 can include a driver/receiver unit 302, which can be connected electrically to the transmitter 306 and the receiver 304. As shown in FIG. 4, 'noise' 308 is represented symbolically by a bullhorn. The noise 308 may be noise associated with an external noise source, an example of which can be regulator noise (e.g., an active ultrasonic noise source). A drive configuration 318 is also shown in FIG. 4 with a noise level 316 and a signal level 317.

A drive voltage of 20V provided with respect to the transmitter 306 and receiver 304 can result in a sensitivity of, for example, 1 my. In comparing the design of the ultrasonic transducer 300 shown in FIG. 4 to the conventional design of the ultrasonic transducer 100 depicted in FIG. 1, it can be appreciated that an increase in a signal level of the multilayer transducer design shown in FIG. 4 may be similar to a higher drive voltage to raise the signal level above the noise level (i.e., see the noise level 316 and the signal level 317 in FIG. 4).

The ultrasonic transducer 300 can beat or overcome an external noise source such as regulator noise (e.g., noise 308 associated with the noise level 316 shown in the drive configuration 318). This is clear from the drive configuration 318, which indicates that the signal level 317 'beats' or overcomes the noise level 316. This stands in contrast to the problems associated with the ultrasonic transducer 100 shown in FIG. 1, wherein the signal level 117 does not overcome the noise level 116 or the noise level 118 associated with the noise 108.

Figure 5:
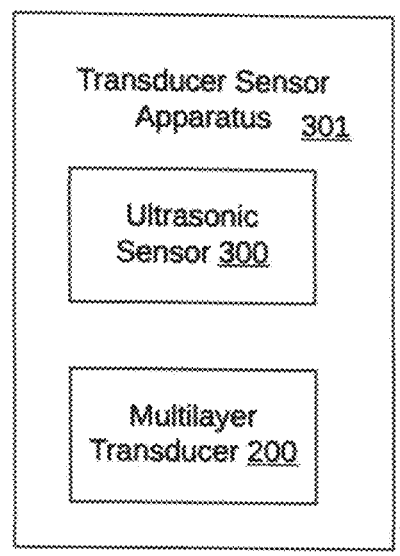
FIG. 5 illustrates a block diagram of a transducer sensor apparatus comprising an ultrasonic sensor and a multilayer transducer, in accordance with an embodiment.

In comparing the ultrasonic transducer 300 shown in FIG. 4 to the conventional ultrasonic transducer 100, it can be appreciated that the transmitter 106 and the receiver 104 can be each implemented with a non-multilayer component and a non-sliced component. In contrast, the transmitter 306 and the receiver 304 shown in FIG. 4 can be each implemented as a multilayer and/or sliced component composed of, for example, a plurality of sliced piezo-ceramic components. Note that in FIG. 5, a block diagram of a transducer sensor apparatus 301 is shown, wherein the transducer sensor apparatus 301 includes the ultrasonic sensor 300 and the multilayer transducer 200, in accordance with an embodiment.

The design of the ultrasonic transducer 300 depicted in FIG. 4 can be implemented in the context of an intrinsically safe (IS) configuration. Not that term "IS" as utilized herein relates to the field of intrinsic safety and intrinsically safe circuits, systems, and devices. Intrinsic safety is a protection technique for the safe operation of electrical equipment in hazardous areas by limiting the energy, electrical and thermal, available for ignition. Intrinsic Safety (IS) is an approach to the design of equipment going into hazardous areas. One of the goals of IS can be to reduce the available energy to a level where it is too low to cause ignition. This can involve preventing sparks and keeping temperatures low.

It can be appreciated that the ultrasonic transducer 300 can be implemented in the context of, for example, a group of sliced ceramic piezoelectric elements such as shown in FIG. 2 and FIG. 3. The ultrasonic transducer 300 can also be implemented in the context of, for example, a sensor that includes the ultrasonic transducer of the Q.Sonic® Series 6 family of Honeywell/Elster ultrasonic flow meters. Non-limiting examples of such a sensor are disclosed in the document "Ultrasonic Flowmeter Series 6 Q.Sonic plus, Manual Operation and Maintenance," elster Instromet, 73023467_B_EN, i 2018-06-07, Doc: 10000050188, Elster GmbH, which is incorporated herein by reference in its entirety.

Note that the term "ultrasonic flow meter" or "ultrasonic flowmeter" as utilized herein can refer to an inferential measurement device that can include ultrasonic transducers that located along, or example, a pipe's wall. Such transducers may be inserted into the piping using a gas tight mechanism. Ultrasonic pulses can be alternately transmitted by one transducer and received by the other one. In the example shown in FIG. 4, ultrasonic pulses may be transmitter by the transmitter 306 (multilayer transducer) and received by the receiver 304 (multilayer transducer).

In some embodiments, a multilayer piezo element such as the multilayer piezo element of the ultrasonic transducer 300 can be designed to function as a simple replacement component without the need for other design modifications. The ultrasonic transducer 300 can be implemented in the context of an IS design and system as discussed previously.

Based on the foregoing, it can be appreciated that a number of preferred and alternative embodiments are disclosed herein. For example, in an embodiment, a transducer sensor apparatus can include a sensor (such as described herein), and a multilayer transducer comprising a plurality of piezoelectric elements. The sensor can include the multilayer transducer, and the multilayer transducer can improve a signal-to-noise ratio during sensing operations by the sensor by overcoming an external noise source.

In an embodiment of the transducer sensor apparatus, the external noise source may be a regulator noise.

In an embodiment of the transducer sensor apparatus, the sensor may be an ultrasonic sensor.

In an embodiment of the transducer sensor apparatus, the sensor may be a flow measurement device.

In an embodiment of the transducer sensor apparatus, the flow measurement device may be an ultrasonic gas flow meter.

In an embodiment of the transducer sensor apparatus, the sensor can be located between one or more transmitters and one or more receivers, and the multilayer transducer can include the transmitter(s) and the receiver(s).

In an embodiment of the transducer sensor apparatus, each piezoelectric elements among the plurality of piezoelectric transducers can comprise a piezo-ceramic element.

In an embodiment of the transducer sensor apparatus, the piezo-ceramic element can comprise one or more of: zirconate titanate (PZT), barium titanate (BaTiO3) and bismuth sodium titanate.

In an embodiment of the transducer sensor apparatus, the external noise source may be associated with an industrial application requiring intrinsic safety.

In another embodiment, a method of operating a transducer sensor apparatus, can involve: providing a sensor and a multilayer transducer comprising a plurality of piezoelectric elements, the sensor including the multilayer transducer; and improving with the multilayer transducer, a signal-to-noise ratio during sensing operations by the sensor by overcoming an external noise source in an industrial application.

In another embodiment, a transducer sensor apparatus can include: a sensor comprising an ultrasonic sensor comprising a flow measurement device, wherein the sensor is located between at least one transmitter and at least one receiver; and a multilayer transducer comprising a plurality of piezoelectric elements, the sensor including the multilayer transducer, wherein the multilayer transducer improves a signal-to-noise ratio during sensing operations by the sensor by overcoming a regulator noise associated with an industrial application.

It will be appreciated that variations of the above-disclosed embodiments and examples and other features and functions, or alternatives thereof, may be desirably combined into many other different systems or applications. It will also be appreciated that various presently unforeseen or unanticipated alternatives, modifications, variations or improvements therein may be subsequently made by those skilled in the art which are also intended to be encompassed by the following claims.

What is claimed is:

1. A transducer sensor apparatus, comprising:
   an ultrasonic sensor; and
   a multilayer transducer comprising a plurality of piezoelectric elements, wherein the multilayer transducer improves a signal-to-noise ratio during sensing operations by the ultrasonic sensor, by overcoming a noise level of an external noise source, wherein the plurality of piezoelectric elements is operable to increase a signal level above the noise level of the external noise source.

2. The transducer sensor apparatus of claim 1 wherein the external noise source comprises a regulator noise.

3. The transducer sensor apparatus of claim 1 further comprising at least one transmitter and at least one receiver.

4. The transducer sensor apparatus of claim 1 wherein each piezoelectric element in the multi-layer transducer comprises a piezo-ceramic element.

5. The transducer sensor apparatus of claim 4 wherein the piezo-ceramic element comprises at least one of: zirconate titanate (PZT), barium titanate (BaTiO3) and bismuth sodium titanate.

6. The transducer sensor apparatus of claim 1 wherein the external noise source is associated with an industrial application requiring intrinsic safety.

7. A method of operating a transducer sensor apparatus, comprising:
   providing an ultrasonic sensor and a multilayer transducer comprising a plurality of piezoelectric elements; and
   improving with the multilayer transducer, a signal-to-noise ratio during sensing operations by the ultrasonic sensor, by overcoming a noise level of an external noise source in an industrial application, wherein the plurality of piezoelectric elements is operable to increase a signal level above the noise level of the external noise source.

8. The method of claim 7 wherein the external noise source comprises a regulator noise.

9. The method of claim 7 wherein the transducer sensor apparatus comprises a flow measurement device.

10. The method of claim 9 wherein the flow measurement device comprises an ultrasonic gas flow meter.

11. The method of claim 7 further comprising at least one transmitter and at least one receiver.

12. The method of claim 11 wherein the transducer sensor apparatus comprises a flow measurement device.

13. The method of claim 11 wherein the flow measurement device comprises an ultrasonic gas flow meter.

14. The method of claim 7 wherein each piezoelectric element in the multi-layer transducer comprises a piezo-ceramic element.

15. The method of claim 14 wherein the piezo-ceramic element comprises at least one of: zirconate titanate (PZT), barium titanate (BaTiO3) and bismuth sodium titanate.

16. The method of claim 7 wherein the external noise source is associated with the industrial application requiring intrinsic safety.

17. The method of claim 7 wherein the transducer sensor apparatus comprises at least one transmitter.

18. The method of claim 7 wherein the transducer sensor apparatus comprises at least one receiver.

* * * * *